United States Patent [19]
Klein et al.

[11] Patent Number: 5,491,681
[45] Date of Patent: Feb. 13, 1996

[54] PEAK DETECTOR FOR AMPLITUDE MODULATED SIGNALS

[75] Inventors: Hans W. Klein; Sriram Narayan, both of Pleasanton, Calif.

[73] Assignee: I M P, Inc., San Jose, Calif.

[21] Appl. No.: 166,247

[22] Filed: Dec. 13, 1993

[51] Int. Cl.$^6$ ........................................... G11B 7/00
[52] U.S. Cl. .................. 369/124; 369/59; 369/60; 327/58
[58] Field of Search ................. 369/44.11, 124, 369/54, 48, 47, 59, 44.32, 44.28, 56, 60, 44.34, 44.25, 44.29; 327/58, 63, 90, 231, 233, 563

[56] References Cited

U.S. PATENT DOCUMENTS

| | | | |
|---|---|---|---|
| 3,609,562 | 9/1971 | Granata et al. | 369/56 |
| 4,504,937 | 3/1985 | Yonezawa et al. | 369/44.34 |
| 4,849,953 | 7/1989 | Nomura et al. | 369/44.33 |
| 4,878,211 | 10/1989 | Suzuki et al. | 369/54 |
| 4,965,782 | 10/1990 | Mathews | 369/48 |
| 4,974,220 | 11/1990 | Harada | 369/44.28 |
| 5,134,606 | 7/1992 | Sekiguchi et al. | 369/54 |
| 5,303,217 | 4/1994 | Bakx et al. | 369/48 |

OTHER PUBLICATIONS

Roubik Gregorian and Gabor C. Temes, *Analog MOS Integrated Circuits for Signal Processing*, 1986, Chpt. 6, pp. 444–446.

Rolf Schaumann, Mohammed S. Ghausi and Kenneth R. Laker, *Design of Analog Filters Passive Active RC and Switched Capacitor*, 1990, Chpt. 7, pp. 444–445.

*Primary Examiner*—Nabil Z. Hindi
*Attorney, Agent, or Firm*—Majestic, Parsons, Siebert & Hsue

[57] ABSTRACT

A circuit for detecting when peaks occur in an amplitude modulated electrical signal, and for measuring in real time the amplitudes of the detected peaks. The circuit delays the input signal a short time, and then notes when the input signal and its delayed version have the same amplitude, thereby to detect when a peak has occurred. The amplitude of the peak is then measured. This circuit and technique have particular advantages when used as part of a servo control system that positions a read/write head to accurately follow moving tracks of recorded data on magnetic tape, magnetic disks, optical disks, and the like.

11 Claims, 5 Drawing Sheets

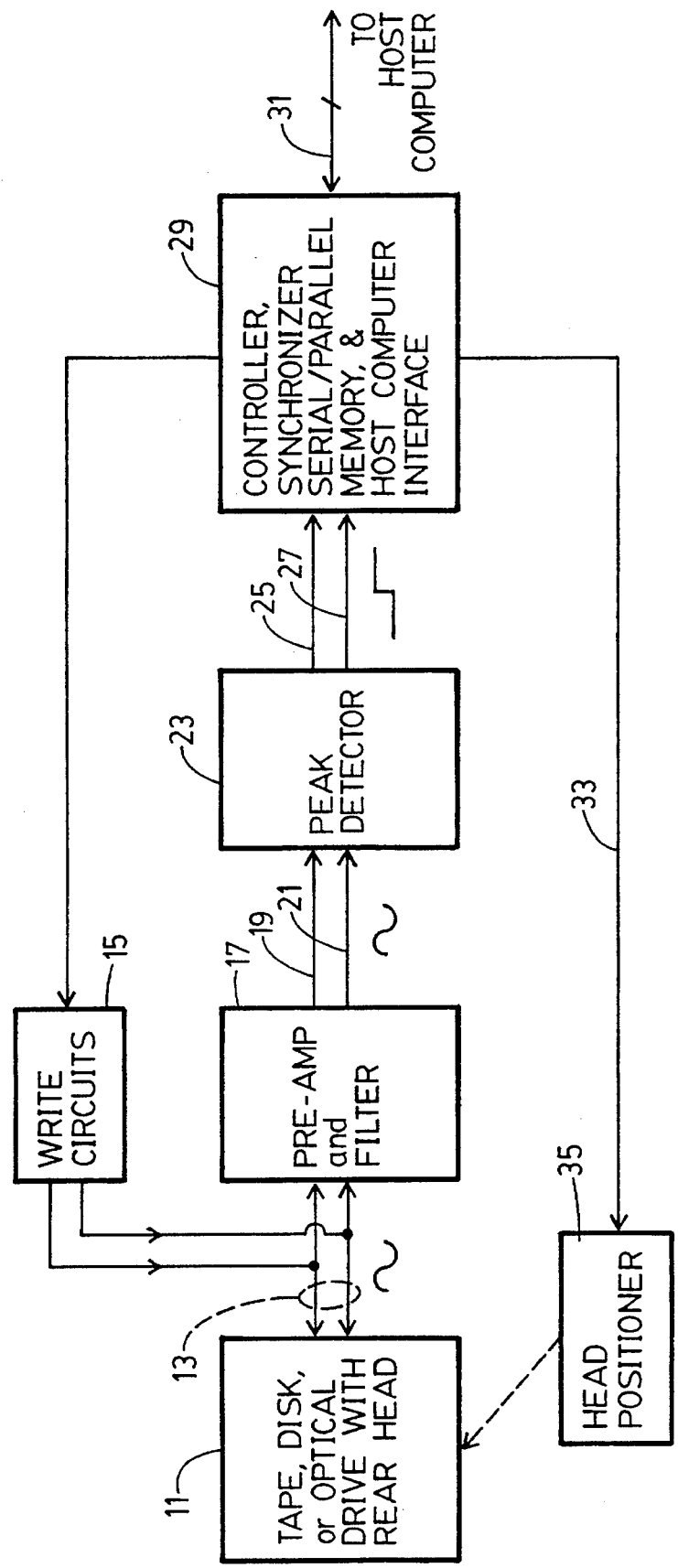
FIG._1.

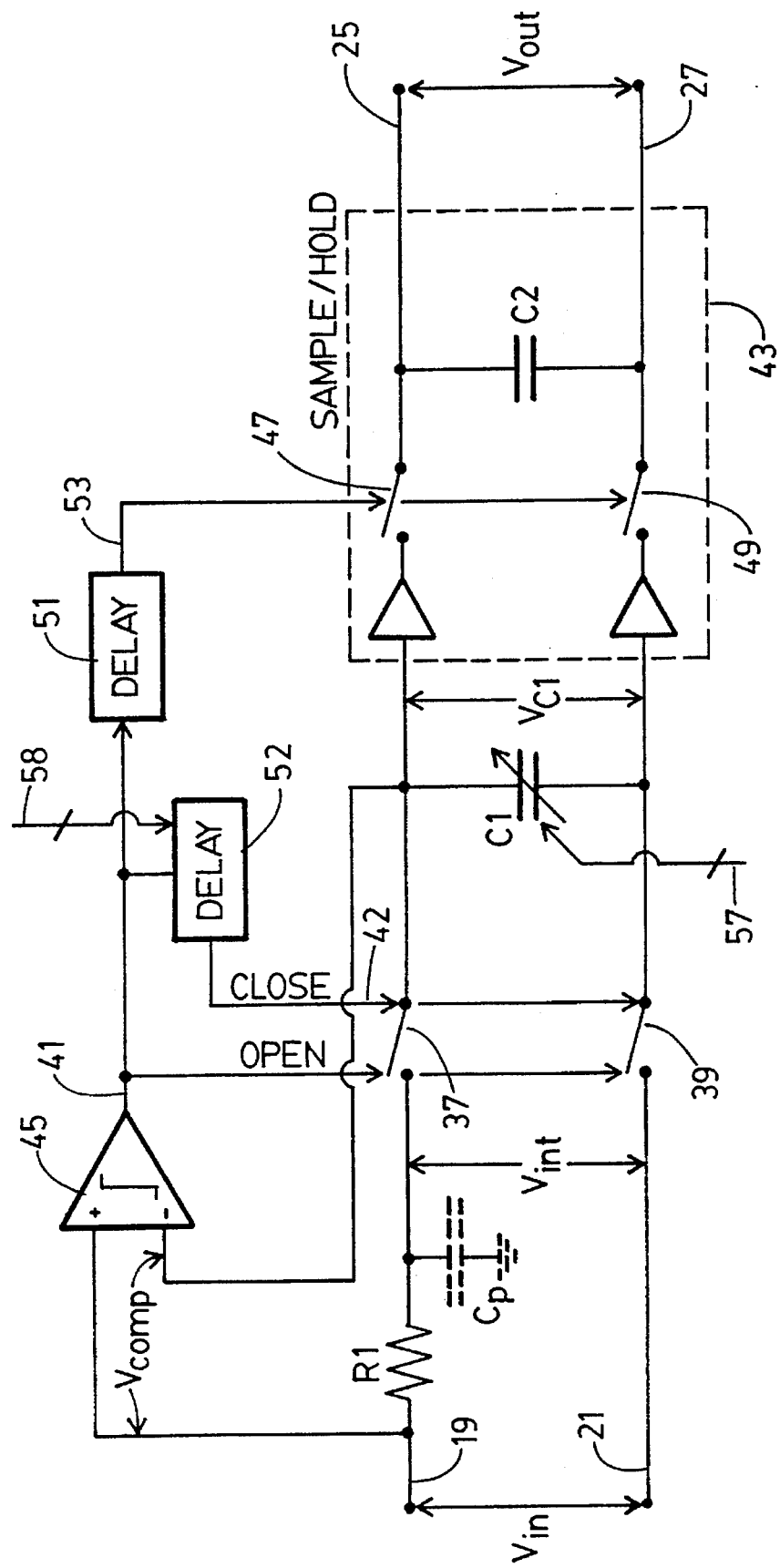
FIG._2.

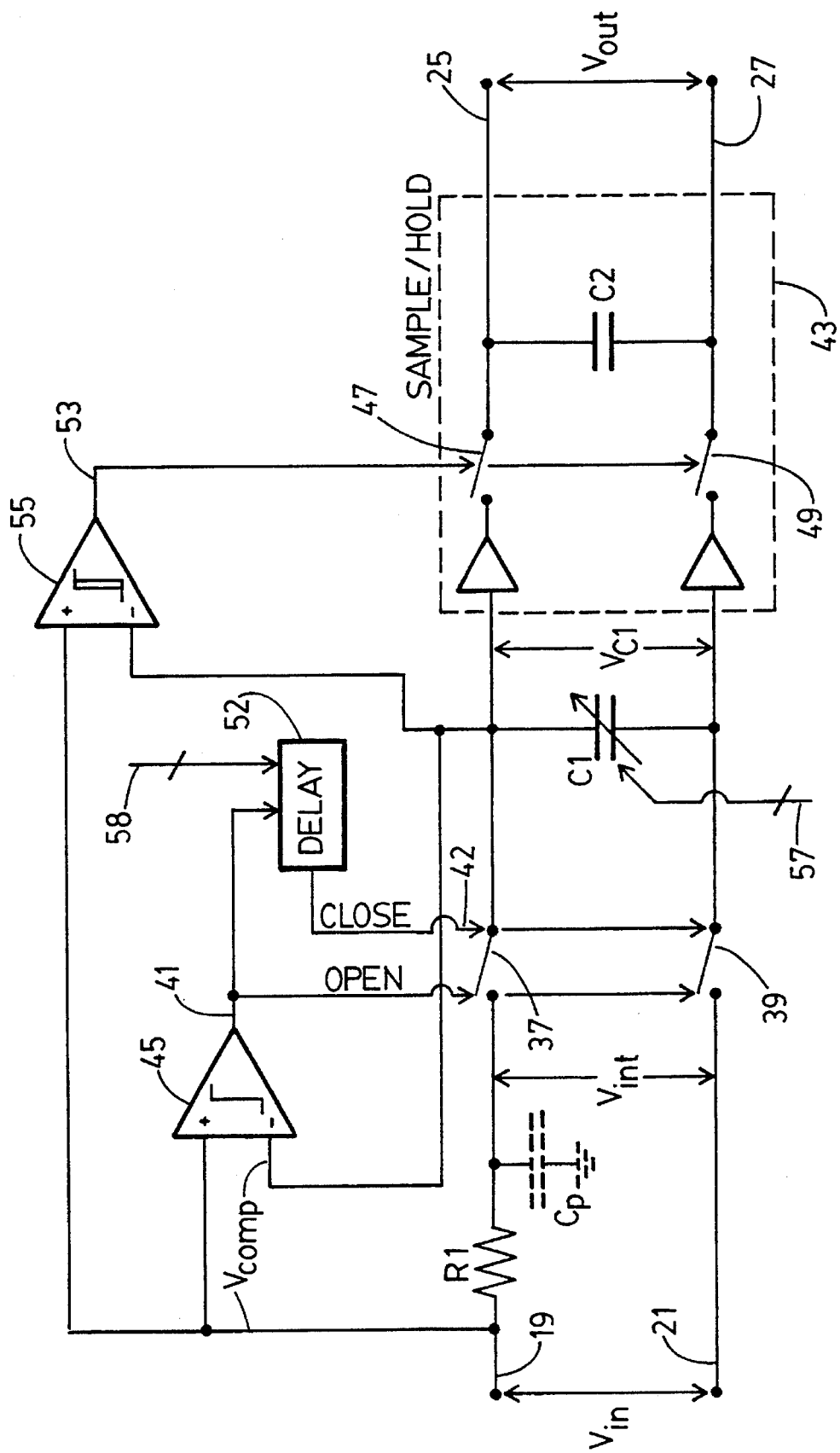
FIG._3.

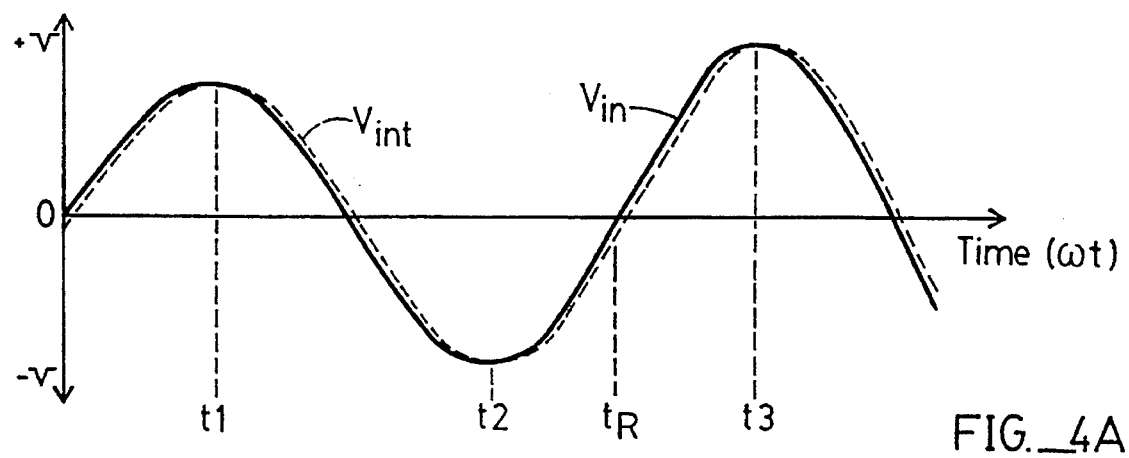
FIG._4A.
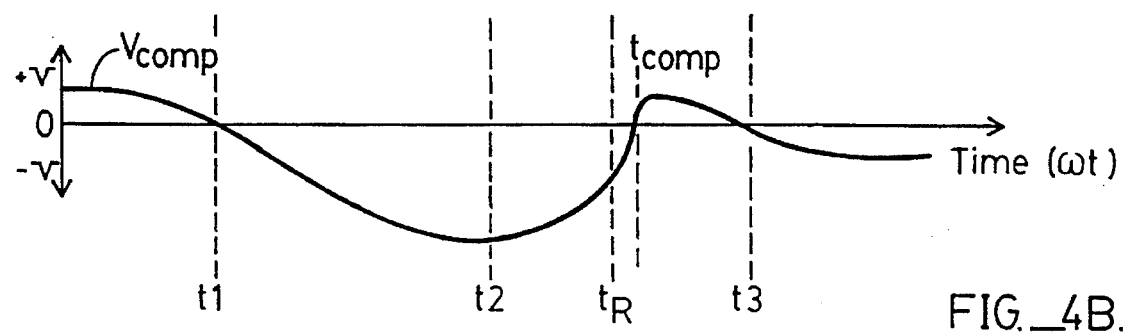
FIG._4B.
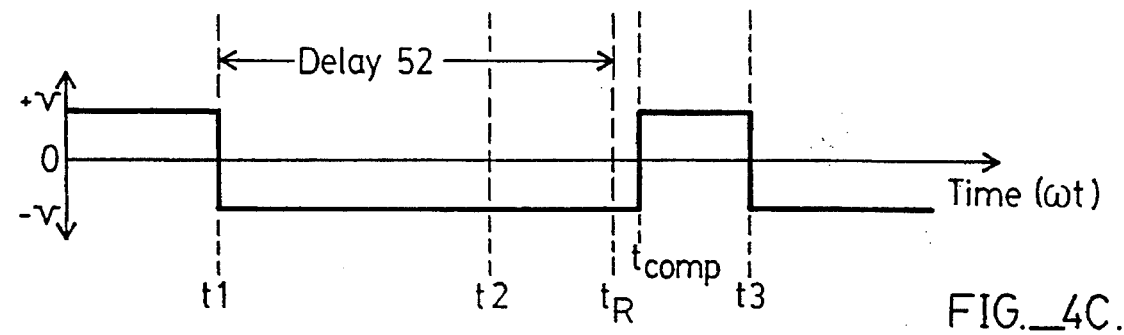
FIG._4C.
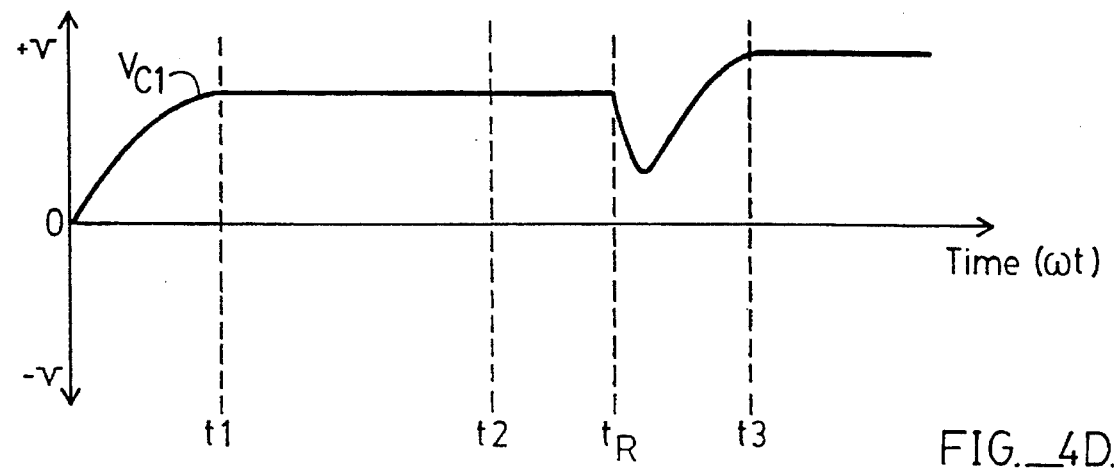
FIG._4D.

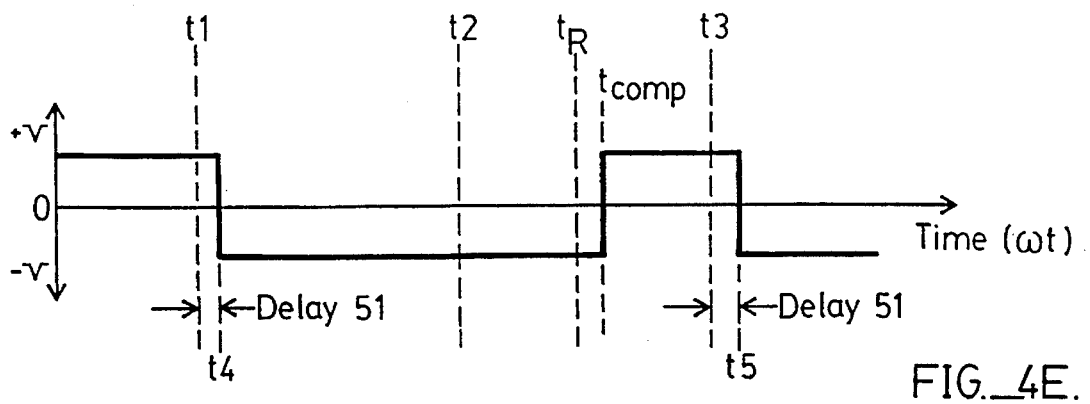
FIG._4E.
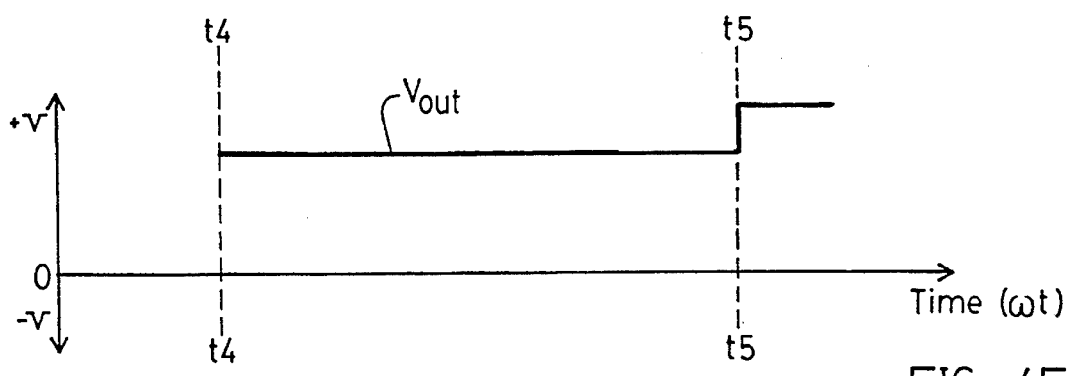
FIG._4F.
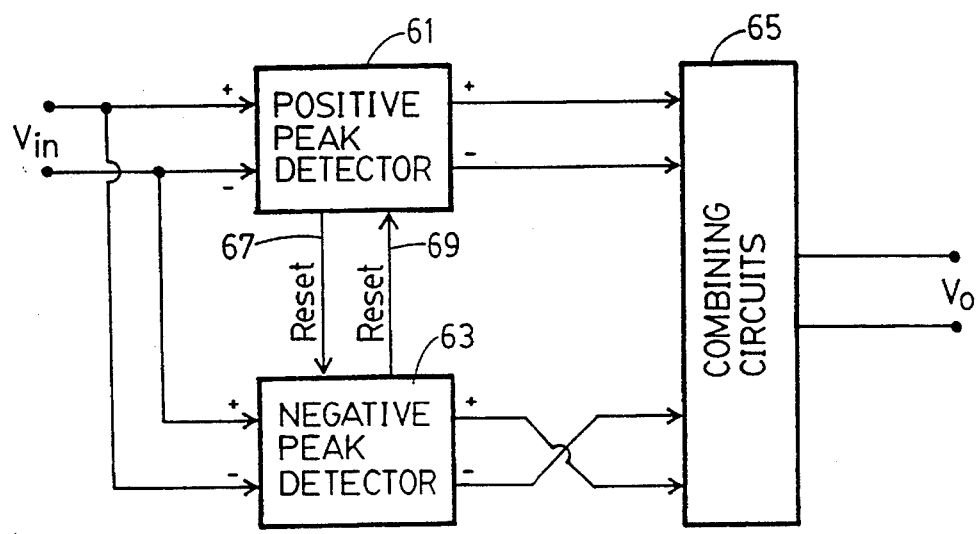
FIG._5.

PEAK DETECTOR FOR AMPLITUDE MODULATED SIGNALS

BACKGROUND OF THE INVENTION

This invention relates generally to electronic circuits for detecting the occurrence and magnitude of peaks of amplitude modulated signals, particularly such circuits employed to detect peaks in analog signals read from magnetic disks or tape or optical disks.

State-of-the-art magnetic and optical mass storage systems record data on numerous tracks that are positioned extremely close to one another. It is therefore difficult to maintain a read/write head precisely aligned with a given recording track because of mechanical inaccuracies and instabilities which, although very small, become significant with such close spacing of the tracks. Therefore, servo signals are periodically recorded on each track along with a desired data signal. The known servo signals are read by the head and commands then issued to realign the head with respect to the data track if the detected servo signal is not what is expected.

Such a servo system usually utilizes one or more phase locked loops to synchronize to the signal being read from the track. Certain disadvantages exist with this approach, however. One disadvantage is that phase locked loops require some time to lock onto the incoming signal and this delay can be, in many circumstances, unacceptable. Also, precision phase locked loops need very well controlled filters which typically require external components or very large silicon substrate area integrated circuits. Further, since the drive speed of the media, particularly in the case of tape drives, can vary substantially, a phase locked loop also has to be able to synchronize with signals having a frequency extending over a wide range, thus resulting in the need to repetitively program both the phase locked loop and its filter.

Existing phase locked loop systems use a clock generated by the loop to sample the incoming analog signal at certain time intervals which are assumed to coincide with the amplitude peaks. A measurement of the occurrence and magnitude of peaks constitutes a demodulation of the incoming amplitude modulated analog signal. As the speed of the recording media varies somewhat, however, phase shifts occur in the signal without an immediate correction in the sampling rate, thereby rendering measurements of peaks to be inaccurate. This results in random positioning errors of the read/write head which in turn significantly can increase the error rate of data being written into or being read from the storage system.

Therefore, it is a primary object of the present invention to provide an improved peak detector circuit for a wide variety of applications including the above-described mass storage systems.

SUMMARY OF THE INVENTION

This and additional objects are accomplished by the present invention, wherein briefly and generally, a peak detecting circuit is provided that shifts an input amplitude modulated analog signal a small amount in phase, compares the phase shifted signal with the input signal, detects when the amplitudes of the compared signals coincide as the occurrence of peaks in the input signal, and then measures the amplitude of the signal at the detected peaks. This circuit has a significant advantage over the use of a phase locked loop in mass storage systems because the circuit immediately adapts to any shift of the relative phase of the incoming signal. The circuit does not require a reference clock of any kind. Therefore, a servo signal being read from a media, such as magnetic tape, whose speed is varying, is still accurately demodulated. The peak detector circuit of the present invention follows the input signal in real time and is insensitive to the phase shifts of the input signal. The peak detector circuit of the present invention can also be easily controlled to accept signals having much different carrier frequencies, such as would be encountered in a tape drive having different speeds.

Additional objects, advantages and features of the present invention will become apparent from the following description of its preferred embodiments, which description should be taken in conjunction with the accompanying drawings.

BRIEF DESCRIPTION OF THE DRAWINGS

FIG. 1 shows generally a mass storage system of the type in which the improved peak detector circuit of the present invention has useful application;

FIG. 2 is a circuit diagram of one embodiment of the peak detector of FIG. 1;

FIG. 3 is a circuit diagram of another embodiment of the peak detector of FIG. 1;

FIGS. 4A–4F are waveforms that illustrate the operation of the peak detector circuits of FIGS. 2 and 3; and FIG. 5 schematically illustrates the use of two peak detectors of the type of FIGS. 2 or 3 for detecting both positive and negative peaks of a differential input signal.

DESCRIPTION OF THE PREFERRED EMBODIMENTS

Referring initially to FIG. 1, a mass storage system is illustrated in order to show one important application of the peak detector circuit and method of the present invention. A storage drive unit 11, such as a tape drive, a rotating magnetic disk drive, or a rotating optical disk drive, includes a read/write head (not shown) to which circuits 13 are connected. A write circuit 15 provides the amplitude modulated signal for storage on the media within the system 11 in cases where the system is other than a read-only system. A signal read by the read/write head is initially applied to preamplifier and filter circuits 17 and thence over lines 19 and 21 to a peak detector circuit 23. An amplitude of the detected peaks is conveyed over lines 25 and 27 to a system portion 29 that includes a controller, data synchronizer, memory, serial to parallel converter, host computer interface, and other circuits performing functions that are normal for such mass storage systems. The system of FIG. 1 communicates with a host computer over a bus 31.

Included in the circuits 29 is the ability to determine from the demodulated servo signals read from the media in the system 11 whether the head is precisely positioned over the track being read. If not, an error signal is provided in circuits 33 to a head positioning mechanism 35 that physically moves the head, in a direction orthogonal to the direction of movement of the data tracks, toward precise alignment with the track being read or written to. Such closed-loop servo control systems are well-known for magnetic disk drives.

The embodiment of the peak detector 23 shown in FIG. 2 will now be described with respect to an example operating timing diagram of FIGS. 4A–4F. A resistor R1 is included in the input signal line 19 and is connected to an appropriate switching circuit 37. The other input signal line 21 has a similar switching circuit 39 in its path. Both of the switches 37 and 39 are simultaneously opened (rendered non-conductive) by a control signal in a line 41, and closed (rendered conductive) by a control signal in a line 42. The switches 37 and 39 are preferably implemented by field effect transistors (FETs). Indeed, a separate resistor R1 need not be formed if the FETs forming the switch 37 are made to provide an "on" resistance of that value. It should also be noted that the switch 39 can be omitted in many applications but is preferred for use when the input voltage signal across lines 19 and 21 is fully differential.

Connected across the output of the switches 37 and 39 is a capacitor C1. A voltage $V_{C1}$ across the capacitor C1 is applied through buffers 48 and 50 to a circuit 43 which includes another storage capacitor C2, either as part of a sample and hold circuit, an integrator, or some other type of circuit. A simplified form of a sample and hold circuit 43 is illustrated in FIG. 2. An output $V_{OUT}$ across lines 25 and 27 provides a signal that gives the amplitude of each successive pulse of an input signal $V_{IN}$. The operation of FIG. 2 illustrated by the waveforms of FIGS. 4A–4F is for a given amplitude modulated signal $V_{IN}$ of FIG. 4A. A resulting voltage $V_{C1}$ is illustrated in FIG. 4D, and a resulting voltage $V_{OUT}$ is illustrated in FIG. 4F.

The value of the resistance R1, inherent resistances (not shown) in the circuit, the capacitor C1 and parasitic capacitance $C_p$ are chosen and controlled to provide a low pass filter having a corner frequency that is substantially higher than the carrier frequency of the incoming signal $V_{IN}$. This results in an intermediate voltage $V_{INT}$ between an output of the resistor R1 and the input line 21 that is a replica of the input signal $V_{IN}$ but delayed a short time, as illustrated in FIG. 4A. The delay as shown occurs when the switches 37 and 39 are closed, it being somewhat different when those switches are open since the total amount of capacitance in the filter portion of the circuit is changed. A comparator 45 has its two inputs connected across a series combination of the resistance R1 and the switch 37. This connection results in an output in line 41 changing states as the amplitude of the delay signal $V_{INT}$ changes from being less than the input voltage $V_{IN}$ to a value that is greater than $V_{IN}$, or vice versa, so long as the switch 37 remains closed. This switching output voltage in line 41 is illustrated in FIG. 4C.

FIG. 4B shows a voltage input $V_{COMP}$ to the comparator 45. This is the voltage across the resistor R1 and the switch 37. That voltage represents a difference between the input signal $V_{IN}$ and its delayed version $V_{INT}$ when the switch 37 is closed, and a difference between $V_{IN}$ and $V_{C1}$ when the switch 37 is opened. It is when $V_{COMP}$, as shown in FIG. 4B, crosses zero that the comparator 45, which has no hysteresis, switches from one of its states to the other. Referring to the timing diagrams of FIG. 4, the comparator 45 is shown to switch states at time t1 and causes the switches 37 and 39 to be opened at that time. These switches remain opened until closed by a reset signal in the line 42 at time $t_R$ from a delay circuit 52. At time t3, the comparator output in line 41 switches back again to open the switches 37 and 39. The comparator 45 has thus detected successive positive peaks of the input signal $V_{IN}$ at times t1 and t3, by monitoring when the difference voltage $V_{COMP}$ (FIG. 4B) crosses zero in a negative going direction.

The delay circuit 52 causes the switches 37 and 39 to be closed (reset) a fixed time after the comparator 45 detects a peak, as a result of the comparator output in line 41 triggering the delay. This delay period is made long enough to avoid closing the switches 37 and 39 before a negative peak of $V_{IN}$, such as that occurring at time t2 in the example being described. The delay is made short enough, however, to assure that the capacitor C1 is following the input voltage $V_{IN}$ before the occurrence of the next positive peak of $V_{IN}$ at time t3. As can be seen from FIG. 4D, the capacitor C1, after being disconnected from the input voltage $V_{IN}$ at time t1, is reconnected to follow the voltage $V_{IN}$ at the reset time $t_R$ but it takes some time for it to do so. It is convenient, but not necessary, to provide a delay 52 such that the reset time $t_R$ occurs at about a positive going zero crossing of the input voltage $V_{IN}$, the example being shown in the waveforms of FIG. 4. This then gives about one-quarter of a cycle of $V_{IN}$, for periodic signals, for the capacitor C1 to begin following the new voltage impressed upon it when the switches 37 and 39 are closed at time $t_R$. Alternative to use of the delay circuit 52, another comparator with inputs connected across input terminals 19 and 21 can be employed to generate, at its output, the reset signal in line 42 when the positive going zero crossing of the input voltage $V_{IN}$ is detected. This alternative implementation has an advantage that the circuit is then fully adaptive to changes in relative phase and carrier frequency of the input signal.

It can be seen from FIG. 4A that a very small phase difference between the signals $V_{IN}$ and $V_{INT}$ results in their amplitudes crossing at the peaks of the signal $V_{INT}$. Prior to a peak, the amplitude of one of these two signals is lower than the other, and after a peak, this relative polarity switches. This is thus a convenient way to detect signal peaks. The phase delay between the two signals $V_{IN}$ and $V_{INT}$ is preferably made as small as can be detected without various noise factors causing erroneous detections. It can be seen from FIG. 4A that as the curve $V_{INT}$ is moved further to the right with respect to the curve $V_{IN}$ (the result of increasing the delay of the signal $V_{INT}$) the two signals will cross each other some time after the peaks of the input signal $V_{IN}$. Therefore, it is preferred to have this phase delay be less than about five per-cent of a wavelength of the carrier frequency of the incoming amplitude modulated analog signal $V_{IN}$.

However, even when the relative phase difference is outside of that range, the error in not detecting the exact peak of the incoming signal does not usually matter in the mass storage system of FIG. 1 since it is the relative magnitudes of the peak signal values that are being processed, not their absolute magnitudes. An increase in the phase difference results in the two curves $V_{IN}$ and $V_{INT}$ crossing each other at a time after the peak. However, such a crossing point occurs at an amplitude level of the signal that is about the same percentage of the peak voltage over a wide range of peak voltages. Even when a precise measure of the amplitudes of the peaks is not required, however, the phase difference between curves $V_{IN}$ and $V_{INT}$ should be less than about one-tenth of the wavelength of their carrier.

Referring again to FIG. 2, it will be seen that the voltage $V_{C1}$ across the capacitor C1 is maintained for a time at the value existing when the switches 37 and 39 are opened, such as occurs at times t1 and t3 of FIG. 4D when successive positive peaks of the input signal $V_{IN}$ are detected. This stored voltage $V_{C1}$ is equal to, or related in a predetermined manner to, the amplitude of the signal $V_{IN}$ at the immediately preceding detected peak. As the switches 37 and 39 are closed at time $t_R$, the voltage of the capacitor C1 again begins to track the input voltage $V_{IN}$ until the switches 37 and 39 are again opened at time t3. Thereafter, the voltage across the capacitor C1 is maintained for a time to be that of the peak of the input signal $V_{IN}$ at time t3, or a value related to it in a known manner.

It is thus desired to measure the voltage across the capacitor C1 shortly after encountering each peak of the incoming voltage. This is done by closing switches 47 and 49 a short time after the switches 37 and 39 are opened, that time being set by another delay circuit 51 in the embodiment of FIG. 2. An output 53 of the delay circuit 51 controls the switches 47 and 49. An example signal on the line 53 is illustrated in FIG. 4E. It can be seen that the falling edges of that signal, at times t4 and t5, follow respective times t1 and t3 by a fixed amount that is set by the delay circuit 51. This delay gives the circuit time to settle down in case the comparator 45 is switching back and forth between its two output states for a short time as the signal peaks are being detected. It is at times t4 and t5 that the voltage of the capacitor C1 is connected, through the buffers 48 and 50, to the capacitor C2. The switches 47 and 49 are maintained in a closed position for a time sufficient to charge the capacitor C2 to a voltage that is proportional to $V_{C1}$. The output voltage $V_{OUT}$ across lines 25 and 27, illustrated in FIG. 4F, is the voltage across the capacitor C2. This voltage level, which changes after detection of each positive peak of the input signal $V_{IN}$, represents the value of the amplitude of each peak of that signal.

FIG. 3 shows another embodiment of the peak detector 23 of FIG. 1, the only difference being the use of a second comparator 55 in place of the delay circuit 51 of FIG. 2. The comparator 55 is chosen to have hysteresis so that it switches state a short interval after the comparator 45, without hysteresis, does so. The two inputs of the comparator 55 are connected to the same points as the inputs of the comparator 45. An output waveform in line 53 is substantially the same as that described above with respect to FIG. 4E.

It can be seen that the peak detector circuit embodiments of FIGS. 2 and 3 follow the incoming signal $V_{IN}$ and detect its peaks in real time. No fixed clock or other reference is required. The reference used to detect the signal peaks is a delayed version of that same signal which is generated by the circuit itself. Thus, the circuit responds instantly to any relative changes of phase of the incoming signal $V_{IN}$.

However, if significant changes in the carrier frequency of the signal $V_{IN}$ are to be encountered, it may be desirable to adjust the corner frequency of the low pass RC filter described above. Accordingly, as an optional feature, the capacitor C1 is shown to be variable in capacity, in response to a control signal in a circuit 57. Alternatively, the value of the resistance R1 can be changed, or both of them can be altered in some cooperative way. The delay imposed by the delay circuit 52 is also adjusted by a control signal in a circuit 58 when a significant change in signal frequency is to be encountered.

As can be seen from the above description, the embodiments of FIGS. 2 and 3 provide the amplitude values of the successive positive peaks but not for the negative peaks. If both positive and negative peaks of an input signal $V_{IN}$ are to be detected, two such circuits of either of the embodiments of FIGS. 2 or 3 are utilized. Referring to FIG. 5, two such circuits 61 and 63 are connected in parallel. Inputs to the circuits both receive the incoming amplitude modulated analog signal $V_N$, but in reversed polarity. Thus, while the peak detecting circuit 61 outputs successive values representing the amplitude of positive going peaks, the second similar peak detecting circuit 63 outputs amplitude values as successive negative going peaks. These values are received by appropriate circuits 65 that combine them into a useful signal output $V_O$.

When two such peak detectors are used together in the manner of FIG. 5, the reset signal required by each of the circuits 61 and 63 in their respective lines 42 may be obtained from the other, as indicated by the lines 67 and 69, thus allowing the delay circuits 52 or an alternative comparator to be eliminated from each. The line 67 connects the delayed peak detecting signal in the line 53 of the circuit 61 to the reset line 42 of the circuit 63. Similarly, the line 69 connects the delayed peak detecting signal in the line 53 of the circuit 63 to the reset line 42 of the circuit 61. In operation, detection of a positive peak by one of the circuits 61 or 63 occurs simultaneously with a negative peak in the other. Thus, switches 37 and 39 of each the peak detecting circuits 61 and 63 are closed (reset) a time after the occurrence of the negative peak in its circuit that is set by the delay circuit 51. The system of FIG. 5 is, therefore, adaptive in the timing of the reset signals to changes in relative phase or carrier frequency of the incoming signal $V_{IN}$.

Although the present invention has been explained with respect to preferred embodiments thereof, it will be understood that the invention is entitled to protection within the full scope of the appended claims.

It is claimed:

1. A method of determination successive ocurrences of peaks in an input signal having a time varying amplitude, comprising the steps of:

shifting the input signal in phase, thereby to develop a phase shifted version of the input signal in a form of a replica thereof, monitoring a difference in the time varying amplitudes of both the input signal and the phase shifted version thereof, detecting successive instances wherein the amplitudes of the input signal and the phase shifted version thereof are substantially equal, thereby to determine successive occurrences of peaks in said input signal, storing the amplitude of the input signal substantially coincident with individual instances of detecting when the input signal and the phase shifted version thereof are substantially equal, said storing step including storing a voltage proportional to that of the input signal amplitude in a first storage element, and charging another storage element with a voltage proportional to the voltage stored in the first storage element at a time after an individual instance of detecting that said amplitude difference is equal to substantially zero but before a next occurrence of such a detection.

2. The method according to claim 1, wherein the monitoring step includes the step of monitoring a difference in the time varying amplitudes of the input signal and the phase shifted version thereof, and the detecting step includes the step of detecting when the input signal and the phase shifted version thereof are substantially equal by determining when said amplitude difference is equal to substantially zero.

3. The method according to claim 1, comprising the additional step of deriving said input signal from a read head of a mass storage system of a type that moves past the read head a media that stores binary data encoded signals.

4. A method of determining successive occurrences of peaks in an input signal having a time varying amplitude and including a carrier frequency, comprising the steps of:

shifting the input signal in phase less than about five per-cent of a wavelength of the input signal carrier frequency, thereby to develop a phase shifted version of the input signal in a form of a replica thereof, monitoring amplitudes of both the input signal and the phase shifted version thereof, detecting successive instances wherein the amplitudes of the input signal and the phase shifted version thereof are substantially equal, thereby to determine successive occurrences of peaks in said input signal, and storing the amplitude of the input signal substantially coincident with individual instances of detecting when the input signal and the phase shifted version thereof are substantially equal.

5. The method according to claim 4, comprising the additional step of deriving said input signal from a read head of a mass storage system of a type that moves past the read head a media that stores binary data enclosed signals.

6. The method according to claim 4 wherein the input signal shifting step includes passing the input signal through a resistor-capacitor circuit.

7. A method of determining successive occurrences of peaks in an input signal having a time varying amplitude and including a carrier frequency, comprising the steps of:

shifting the input signal in phase, including passing the input signal through a low pass filter having a corner frequency that is substantially higher than the input signal carrier frequency, thereby to develop a phase shifted version of the input signal in a form of a replica thereof, monitoring amplitudes of both the input signal and the phase shifted version thereof, detecting successive instances wherein the amplitudes of the input signal and the phase shifted version thereof are substantially equal, thereby to determine successive occurrences of peaks in said input signal, and storing the amplitude of the input signal substantially coincident with individual instances of detecting when the input signal and the phase shifted version thereof are substantially equal.

8. The method according to claim 7, comprising the additional step of deriving said input signal from a head of a mass storage system of a type that moves past the read head a media that stores binary data encoded signal.

9. The method according to claim 7 wherein the detecting step includes comparing a level of the input signal with a level of a signal output of said low pass filter.

10. The method according to claim 9, wherein the phase shifting step includes shifting the input signal less than about five per-cent of a wavelength of the input signal carrier frequency.

11. The method according to claim 10 wherein the storing step includes storing a voltage proportional to that of the input signal amplitude in a first storage element, said method comprising the additional step of charging another storage element with a voltage proportional to the voltage stored in the first storage element at a time after an individual instance of detecting that said amplitude difference is equal to substantially zero but before a next occurrence of such a detection.

* * * * *

UNITED STATES PATENT AND TRADEMARK OFFICE
CERTIFICATE OF CORRECTION

PATENT NO. : 5,491,681
DATED : February 13, 1996
INVENTOR(S) : Klein et al.

It is certified that error appears in the above-indentified patent and that said Letters Patent is hereby corrected as shown below:

In Column 6, line 21 in Claim 1 replace:
    "1. A method of determination successive ocurrences of"
with:

--1. A method of determining successive occurrences of--

In Column 7, line 10 in Claim 5 replace:
    "head a media that stores binary data enclosed signals."
with:

--head a media that stores binary data encoded signals.--

In Column 8, line 9 in Claim 8 replace:
    "head a media that stores binary data encoded signal." with --head a media that stores binary data encoded signals.--

UNITED STATES PATENT AND TRADEMARK OFFICE
CERTIFICATE OF CORRECTION

PATENT NO. : 5,491,681
DATED : February 13, 1996
INVENTOR(S) : Klein et al.

It is certified that error appears in the above-indentified patent and that said Letters Patent is hereby corrected as shown below:

In The Drawings, Sheet 1 of 5, the text of Box 11 replace: "TAPE, DISK, or OPTICAL DRIVE WITH REAR HEAD" with --TAPE, DISK, or OPTICAL DRIVE WITH READ HEAD--

Signed and Sealed this

Second Day of July, 1996

Attest:

BRUCE LEHMAN

Attesting Officer

Commissioner of Patents and Trademarks